(12) United States Patent
Chae et al.

(10) Patent No.: US 10,879,701 B2
(45) Date of Patent: Dec. 29, 2020

(54) PCS EFFICIENCY-CONSIDERED MICROGRID OPERATION DEVICE AND OPERATION METHOD

(71) Applicant: KOREA ELECTRIC POWER CORPORATION, Naju-si (KR)

(72) Inventors: Woo-Kyu Chae, Daejeon (KR); Hak-Ju Lee, Daejeon (KR); Jung-Sung Park, Daejeon (KR); Jong-Nam Weon, Daejeon (KR); Jun-Bo Sim, Daejeon (KR)

(73) Assignee: KOREA ELECTRIC POWER CORPORATION, Naju-si (KR)

( * ) Notice: Subject to any disclaimer, the term of this patent is extended or adjusted under 35 U.S.C. 154(b) by 0 days.

(21) Appl. No.: 16/327,320

(22) PCT Filed: Nov. 11, 2016

(86) PCT No.: PCT/KR2016/013027
§ 371 (c)(1),
(2) Date: Feb. 21, 2019

(87) PCT Pub. No.: WO2018/052163
PCT Pub. Date: Mar. 22, 2018

(65) Prior Publication Data
US 2019/0181644 A1  Jun. 13, 2019

(30) Foreign Application Priority Data

Sep. 13, 2016  (KR) .................. 10-2016-0118018

(51) Int. Cl.
*H02J 3/32*  (2006.01)
*H02J 3/38*  (2006.01)
(Continued)

(52) U.S. Cl.
CPC .............. *H02J 3/32* (2013.01); *G05B 19/042* (2013.01); *H02J 3/382* (2013.01); *H02J 7/0068* (2013.01);
(Continued)

(58) Field of Classification Search
None
See application file for complete search history.

(56) References Cited

U.S. PATENT DOCUMENTS

2012/0074909 A1* 3/2012 Hondo .............. H02J 13/00009
320/128
2015/0310366 A1* 10/2015 Yu ..................... G06Q 10/06312
705/7.22
(Continued)

FOREIGN PATENT DOCUMENTS

JP   2000-261960 A   9/2000
JP   2011-114900 A   6/2011
(Continued)

OTHER PUBLICATIONS

Jeong-Uk Kim, "An New Load Control Algorithms based on Power Consumption", Thesis, Jul. 9, 2010, pp. 1658-1662, vol. 59, No. 9, Trans. KIEE, Korea

*Primary Examiner* — Ryan A Jarrett
(74) *Attorney, Agent, or Firm* — Foundation Law Group, LLP

(57) ABSTRACT

The present invention relates to a power conditioning system (PCS) efficiency-considered microgrid operation device comprising: a scheduling unit for scheduling outputs of a controllable load, a battery, and an emergency internal combustion generator operated in a microgrid; and an operation control unit for controlling the operation of the battery, the emergency internal combustion generator, and the controllable load according to charging/discharging of the battery, the output or the emergency internal combustion gen-
(Continued)

erator, and the output of the controllable load, which have been scheduled by the scheduling unit, wherein the scheduling unit schedules charging/discharging by considering the efficiency of a PCS such that a mate of charge (SOC) of the battery is maintained within a preset range. According to the present invention, the microgrid can be efficiently operated by considering the charging/discharging efficiency of the PCS.

16 Claims, 7 Drawing Sheets

(51) Int. Cl.
*H02J 9/08* (2006.01)
*G05B 19/042* (2006.01)
*H02J 7/00* (2006.01)
*G01R 31/382* (2019.01)

(52) U.S. Cl.
CPC .............. *H02J 9/08* (2013.01); *G01R 31/382* (2019.01); *G05B 2219/25419* (2013.01); *G05B 2219/2639* (2013.01); *Y02P 80/14* (2015.11)

(56) References Cited

U.S. PATENT DOCUMENTS

| 2017/0331372 A1* | 11/2017 | Miki | H02J 9/066 |
| 2017/0373501 A1* | 12/2017 | Okamoto | H02J 7/04 |

FOREIGN PATENT DOCUMENTS

| JP | 2015-015793 A | 1/2015 | |
| JP | 2015-037354 A | 2/2015 | |
| JP | 2016-032337 A | 3/2016 | |
| JP | 2016-039685 A | 3/2016 | |
| KR | 10-2014-0052467 A | 5/2014 | |
| KR | 10-1569144 B1 | 11/2015 | |
| WO | 2016/038442 A1 | 3/2016 | |
| WO | WO-2016117236 A1 * | 7/2016 | ................ H02J 7/04 |

* cited by examiner

PCS EFFICIENCY-CONSIDERED MICROGRID OPERATION DEVICE AND OPERATION METHOD

CROSS REFERENCE TO RELATED PATENT APPLICATION

This application claims the benefit under 35 U.S.C. Section 371, of PCT International Application No. PCT/KR2016/013027, filed on Nov. 11, 2016, which claimed priority to Korean Patent Application No. KR 10-2016-0118018, filed on Sep. 13, 2016, the disclosures of which are hereby incorporated by the references.

TECHNICAL FIELD

The present invention relates to a microgrid operation device and method and, more particularly, to a microgrid operation device and method of operating a microgrid by considering efficiency of a power conditioning system (PCS).

BACKGROUND ART

Over the world, in most island areas and isolated areas where no power system is connected, electricity is supplied using small-scale internal combustion power plants.

Most of these regions have high costs of transporting fuel, so that they cannot afford the expensive cost for the same amount of electricity than the area where a main power system is connected.

Recently, new renewable energy of eco-friendly energy devices, which do not incur fuel transportation costs and do not emit greenhouse gases, are spreading in these areas.

However, since the power generation output fluctuates due to the climate, the new renewable energy cannot be controlled. Thus, in order to satisfy the fluctuation of electricity consumption by a consumer (hereinafter referred to as "load"), an energy storage device such as a battery and an emergency generator are required.

The microgrid system is fundamentally configured such that electricity generated by the new renewable energy source is stored in the battery and the load receives the electricity from the battery.

In this case, when the amount of power generated by the new renewable energy source is insufficient and the charging amount of the battery is also insufficient, the system activates the emergency generator to charge the battery.

However, the output fluctuation of the new renewable energy generator is excessive, as well as predicting the output and demand of the new renewable energy is difficult, whereby it is difficult to provide energy in a stable manner.

Therefore, a microgrid operation device is needed to control the output and operation of facilities on the basis of a battery energy storage system (BESS) which uses a new renewable energy source as a main source.

In this case, charging and discharging operations of the BESS are performed through a power conditioning system (PCS).

Efficiency of the PCS varies depending on charging/discharging capacity relative to the rated capacity, and especially is very low when performing charging/discharging at a capacity of 0~20%.

That is, when the PCS efficiency is not taken into consideration when scheduling the charging/discharging of the BESS in the microgrid operation device, the accuracy of calculation is lowered, and as a result, the power supply cost becomes higher.

Therefore, it is necessary to consider the charging/discharging efficiency of the PCS when scheduling the charging/discharging of the BESS.

The matters described in the background art are intended to aid understanding of the background of the invention and may include matters not previously known to those skilled in the art.

DISCLOSURE

Technical Problem

The present invention has been made to solve the above-mentioned problems, and it is an object of the present invention to provide a microgrid operation device and method which considers charging/discharging efficiency of a PCS in order to efficiently operate the microgrid.

Technical Solution

A microgrid operation device considering efficiency of a power conditioning system (PCS) according to an aspect of the present invention includes a scheduling unit scheduling outputs of an emergency internal combustion generator, a controllable load, and a battery operated in a microgrid; and an operation control unit controlling operations of the battery, the emergency internal combustion generator, and the controllable load according to charging/discharging of the battery, the output of the emergency internal combustion generator, and the output of the controllable load, which have been scheduled by the scheduling unit, wherein the scheduling unit schedules the charging/discharging by considering the efficiency of the PCS so that a state of charge (SOC) of the battery is maintained within a preset range.

The scheduling unit may include an emergency internal combustion generator scheduling unit, a controllable load scheduling unit, and a battery scheduling unit, and the battery scheduling unit may include an SOC determination unit determining a current SOC of the battery; a charging/discharging amount calculation unit calculating a charging/discharging amount of the battery; and a PCS efficiency consideration unit considering the efficiency of the PCS.

In addition, the scheduling unit may perform the scheduling by selecting a scheduling control mode as a real-time operation control mode or an emergency operation control mode according to the SOC determined by the SOC determination unit.

In addition, the scheduling unit schedules operations and outputs of the emergency internal combustion generator, the controllable load, and the battery in the real time operation control mode so that a charging amount of the battery is maintained when the charging amount of the battery is within a preset reference range.

The preset reference range of the charging amount of the battery is an SOC of 20% to 80%.

In addition, when performing the scheduling in the real-time operation control mode, the emergency internal combustion generator scheduling unit, the controllable load scheduling unit, and the battery scheduling unit may be provided to schedule the outputs of the emergency internal combustion generator, the controllable load, and the battery by calculating an optimal solution using an objective function for minimizing a total sum of a startup cost and a power generation cost of the emergency internal combustion generator in the microgrid and a constraint condition for the objective function.

Herein, the PCS efficiency consideration unit may receive a PCS target output value calculated by the battery charging/discharging amount calculation unit, calculate a final PCS input value, and provide the calculated PCS input value to the charging/discharging amount calculation unit.

In addition, the scheduling unit may be provided to schedule the operations and outputs of the emergency internal combustion generator, the controllable load, and the battery in the emergency operation control mode so that the charging amount of the battery falls within the preset reference range when the charging amount of the battery is out of the preset reference range.

In addition, the scheduling unit may be provided to calculate a discharging amount of the battery for discharging the battery, stop running the emergency internal combustion generator, and allow the controllable load to be operated by the calculated discharging amount of the battery according to a preset priority, when the charging amount of the battery is higher than the preset reference range.

In addition, the scheduling unit may be provided to calculate a charging amount of the battery for charging the battery, operate the stopped emergency internal combustion generator, and allow the controllable load to be cut off by the calculated charging amount of the battery according to a preset priority, when the charging amount of the battery is lower than the preset reference range.

In addition, the battery charging/discharging amount calculation unit may set a target charging amount of the battery and calculates a final charging/discharging amount in which the PCS efficiency is considered by a following equation, in the emergency operation control mode:

$$SOC(t)=SOC(t-1)+(PCS\text{Charge}-PCS\text{Discharge})\times TPD$$

(herein, SOC(t): a target charging amount state of the battery, SOC(t−1): a current (t−1) charging amount state of the battery, PCS Charge: an input of the PCS, PCS Discharge: an output of the PCS (battery charging amount or battery discharging amount), and TPD: a calculated time period).

A microgrid operation method considering PCS efficiency according to an aspect of the present invention includes determining whether a SOC of a battery operated in the microgrid is included in a preset reference range; calculating an optimal solution by using an objective function for minimizing a total sum of a startup cost and a power generation cost of an emergency internal combustion generator in the microgrid and a constraint condition for the objective function when the SOC of the battery is within the preset reference range; and calculating outputs of the emergency internal combustion generator, a controllable load, and the battery in the microgrid by considering the PCC efficiency through the optimal solution.

The method may further include scheduling operations and outputs of the emergency internal combustion generator, the controllable load, and the battery in a real time operation control mode in which a charging amount of the battery is maintained when the SOC of the battery is within the preset reference range.

In addition, the preset reference range of the SOC of the battery is 20% to 80%.

Herein, the method may further include calculating a discharging amount of the battery to which the PCS efficiency is applied when the SOC of the battery is out of an upper limit value of the preset reference range; and stopping running the emergency internal combustion generator and performing control so that the controllable load is operated by the calculated discharging amount of battery according to a preset priority.

In addition, the method may further include calculating a charging amount of the battery to which the PCS efficiency is applied when the SOC of the battery is out of a lower limit value of the preset reference range; and operating the stopped emergency internal combustion generator and performing control so that the controllable load is cut off by the calculated battery charging amount according to a preset priority.

In addition, the charging amount and the discharging amount of the battery may be calculated in consideration of a PCS input value.

The charging amount and the discharging amount of the battery may set a target charging amount of the battery and a final charging/discharging amount is calculated in consideration of the PCS efficiency by the following equation:

$$SOC(t)=SOC(t-1)+(PCS\text{ Charge}-PCS\text{ Discharge})\times TPD$$

(herein, SOC(t): a target charging amount state of the battery, SOC(t−1): a current (t−1) charging amount state of the battery, PCS Charge: an input of the PCS, PCS Discharge: an output of the PCS (battery charging amount or battery discharging amount), and TPD: a calculated time period).

Advantageous Effects

The BESS-based microgrid operation device and method which considers the PCS efficiency according to the present invention predicts the power generation amount of new renewable energy and the load amount from a small-scale independent renewable energy complex to schedule the charging/discharging of the battery, the output of the emergency internal combustion generator, and the output of the controllable load, thereby performing load leveling and peak shifting of overall loads and managing a state of charge (SOC) of the battery optimally.

In addition, by reducing the number of charging/discharging cycles of the battery, it is possible to drastically reduce the replacement cost of the battery, which is the most expensive device among components of the microgrid system.

In addition, when calculating the output of the PCS, the calculation method is applied to realize the actual equipment characteristics by making the efficiency different according to the PCS output, rather than the calculation method performed by applying a constant input/output efficiency regardless the output of the existing PCS, so that it is possible to operate the PCS and the energy storage device reasonably by reflecting the actual equipment characteristics considering the loss, thereby minimizing the system operation cost.

BEST MODE

Figure 1:
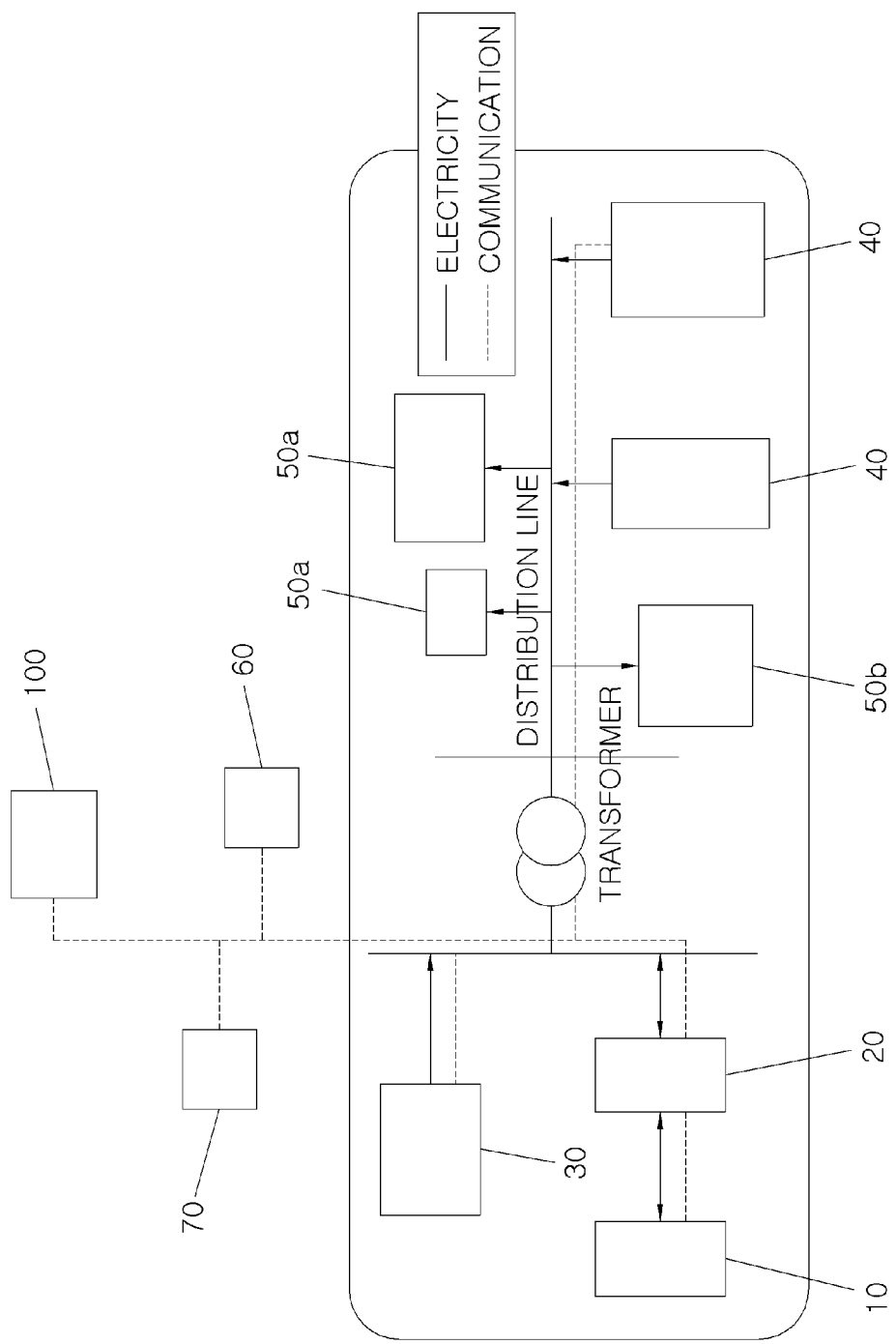
FIG. 1 shows a schematic configuration of a microgrid according to an embodiment of the present invention.

In order to fully understand operational advantages of the present invention and objects achieved by the practice of the present invention, reference should be made to the accompanying drawings which illustrate preferred embodiments of the present invention and contents described in the accompanying drawings.

In describing the preferred embodiments of the present invention, a description of known or repeated descriptions that may unnecessarily obscure the gist of the present invention will be omitted or omitted.

The present invention provides to a battery energy storage system (BESS)-based microgrid operation device and method which considers PCS efficiency, the device and method may be operated optimally by maintaining a state of charge (SOC) of the BESS within the reference range by controlling the output and operation of each equipment in consideration of the charging/discharging efficiency of the PCS.

The PCS efficiency varies depending on charging/discharging capacity relative to the rated capacity. Especially, the efficiency is very low when performing the charging/discharging at a capacity of 0~20% relative to the rated capacity.

When the PCS is operated at a low efficiency section, the power generation cost may be increased in the microgrid due to a large power loss. Although this has not been considered in the past, it is important to operate the PCS at a high efficiency section where possible.

To this end, controllable equipment (a diesel generator, a new renewable energy generator, a controllable load) within the microgrid have to be controlled so that the PCS may be operated at a high efficiency section.

For example, when controlling the output of the diesel generator, the charging/discharging efficiency of the PCS is compared with an output efficiency of the diesel generator to determine the output of the diesel generator.

When the output of the diesel generator is increased, the efficiency of the diesel generator is generally improved. Herein, with respect to a change result of the charging efficiency of the PCS, the output of the diesel generator is controlled in such a manner that the final total efficiency is improved.

When controlling the load (controllable load), the size of the load is controlled in such a manner that the charging/discharging efficiency of the PCS is improved.

In order to achieve the above objects, there is provided a microgrid operation device according to an embodiment of the present invention including a state of charge (SOC) determination unit for determining a current charging amount state of a battery, a scheduling unit for scheduling, in real time, the charging/discharging of the battery, the output of the emergency internal combustion generator, and the output of the controllable load by considering the PCS efficiency, and an operation control unit for controlling operations of the battery, the emergency internal combustion generator, and the controllable load in accordance with the output and control of the charging/discharging of the battery, the output of the emergency internal generator, the output of the controllable load which are scheduled by the scheduling unit.

In addition, a microgrid operation method according to an embodiment of the present invention, includes a SOC determination step of determining the current charging amount state of the battery, a step of scheduling, in real time, the charging/discharging of the battery, the output of the emergency internal combustion generator, and the output of the controllable load, and a step of controlling operations of the battery, the emergency internal combustion generator, and the controllable load in accordance with the charging/discharging of the battery, the output of the emergency internal combustion generator, and the output of the controllable load which are scheduled in the scheduling step.

Hereinafter, a microgrid operation device and method according to a preferred embodiment of the present invention will be described in detail with reference to FIGS. 1 to 8B.

Figure 2:
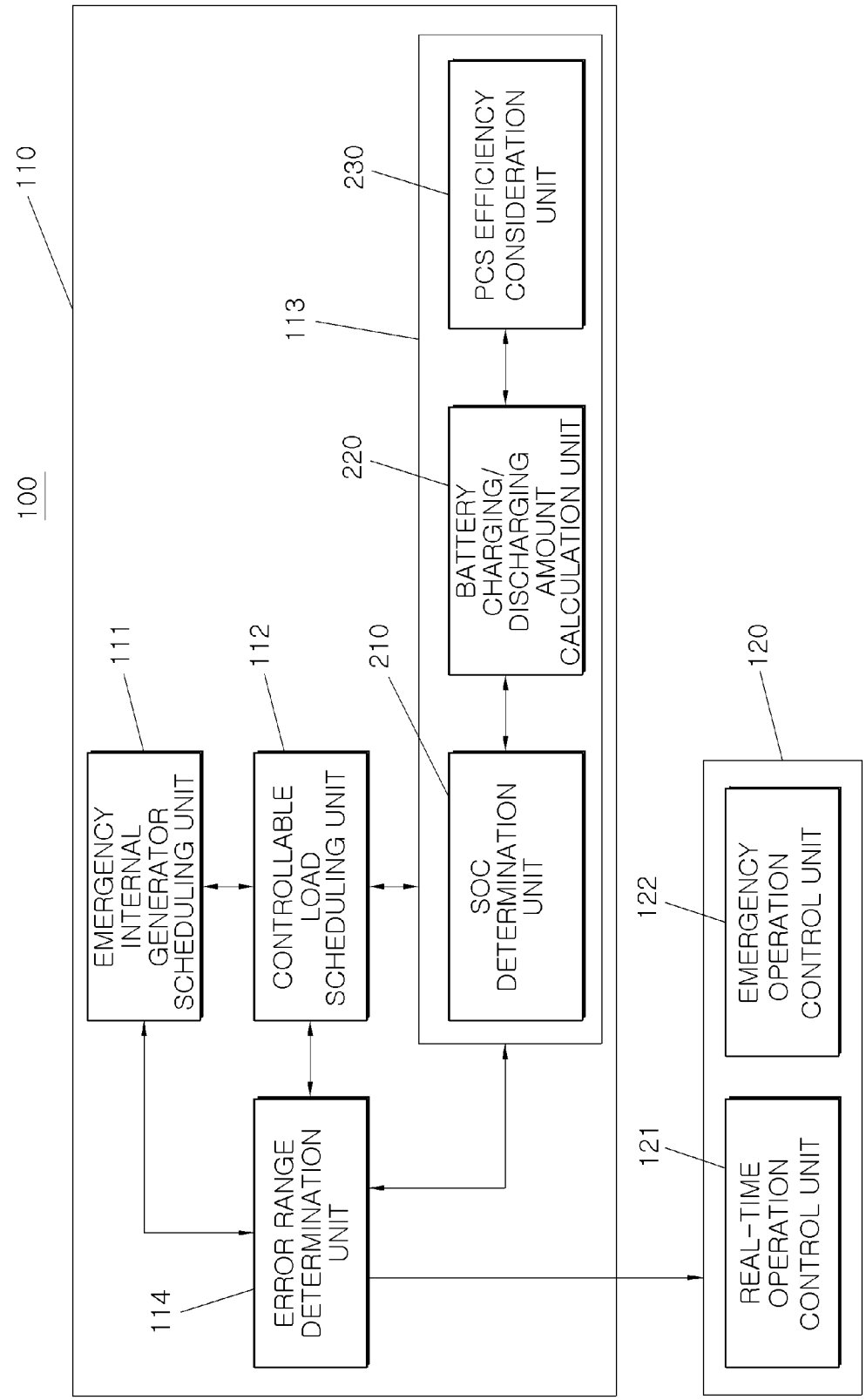
FIG. 2 is a view illustrating a microgrid operation device according to an embodiment of the present invention.

FIG. 1 shows a schematic configuration of a microgrid according to an embodiment of the present invention, and FIG. 2 is a view showing a microgrid operation device according to an embodiment of the present invention.

Referring to FIG. 1, a stand-alone microgrid may be a small-scale power system built on the basis of a new renewable energy source in small island areas and isolated areas.

Such stand-alone microgrid includes an energy storage device 10 such as a battery energy storage system (BESS) (hereinafter, referred to "battery"), at least one power conditioning system (PCS) 20, an emergency internal combustion generator, a renewable energy power source 40 using wind power, solar power, etc., a plurality of loads 50a and 50b, an information collection device 60, a data prediction device 70, and a microgrid operation device 100 for controlling the output and operation of each equipment.

Herein, the load may be divided into a controllable load 50a, such as a water pump, an emergency dump load, and the like, and an uncontrollable load 50b, such as a consumer.

The information collection device 60 is a device for collecting real-time event information such as real-time weather forecast, a load amount of respective loads, and an amount of power generation of the new renewable energy source.

The data prediction device 70 uses real-time event information collected from the information collection device 60 to calculate a predicted power generation amount of the new renewable energy source, a predicted amount of load, a predicted amount of a residual load, and the like at a predetermined period (long period and short period).

The microgrid operation device 100 according to an embodiment of the present invention is controlled such that operation and output of each equipment is scheduled using the data predicted by the data prediction device 70 (a predicted power generation amount of new renewable energy source, a predicted amount of load, a predicted amount of a residual load, and the like)

Referring to FIG. 2, the microgrid operation device 100 according to an embodiment of the present invention includes a scheduling unit 110 and an operation control unit 120. The scheduling unit 110 includes an emergency internal combustion generator scheduling unit 111, a controllable load scheduling unit 112, a battery scheduling unit 113, and an error range determination unit 114.

The battery scheduling unit 113 includes an SOC determination unit 210, a battery charging/discharging amount calculation unit 220, and a PCS efficiency consideration unit 230.

The microgrid operation device 100 of the present invention may control the output and operation of equipment so as to maintain the SOC of the battery within a preset reference range while supplying the demand.

Herein, the scheduling unit 110 is provided to schedule the operation and output of each equipment at a real-time operation control mode that performs control so that the charging amount (SOC) of the battery is maintained when the charging amount of the battery is within a preset reference range, and to schedule the operation and output of each equipment at an emergency operation control mode that performs control so that the charging amount (SOC) of battery is set within the preset reference range when the charging amount of the battery is out of the preset reference range.

Herein, the preset reference range of the SOC may be 20 to 80%, and more preferably 50 to 80%.

To this end, the scheduling unit 110 is provided to determine the SOC of the battery through the SOC determination unit 210 of the battery scheduling unit 113 and select the control mode according to the determined SOC of the battery.

In the case of scheduling at the real-time operation control mode, the emergency internal combustion generator scheduling unit 111, the controllable load scheduling unit 112, and the battery scheduling unit 113 calculate an optimal solution by using an objective function for minimizing the total sum of a startup cost and a power generation cost of the emergency internal combustion generator in the microgrid and the constraint conditions therefor.

Also, the scheduling unit 110 of the present invention schedules the operation and output of equipment by calculating the optimal solution.

The emergency internal combustion generator scheduling unit 111 is provided so that the objective function is expressed to minimize the total sum of the power generation cost and the startup cost of the emergency internal combustion generator as in the following Equation 1, since equipment by which the startup cost and the power generation cost are set is the diesel generator among power generating s equipment in the microgrid.

$$\min \Sigma_{i,t}(FLC_{i,t}+STC_{i,t}) \quad \text{[Equation 1]}$$

Herein, $FLC_{i,t}$ and $STC_{i,t}$ represent the power generation cost and the startup cost at time t of a generator i, respectively.

In addition, $FLC_{i,t}$ may be defined as Equation 2 below.

$$FLC_{i,t}=a_i g_{i,t}+c_i \quad \text{[Equation 2]}$$

Herein, $a_i$, $b_i$, $c_i$ are values representing a cost curve function according to the output of the diesel generator i, $g_{i,t}$ represents the output that the diesel generator i is generating at time t.

The Equation 2 represents the power generation cost in a curve form, but it may be approximated to a linear equation for each section for mathematical calculation.

In order to linearize the power generation cost for each section, a variable $g_{i,t}$ representing the output of each generator has to be divided by the number of sections and may be expressed as Equation 3 below.

$$g_{i,t}=g_i^m u_{i,t}+\Sigma_b g_{i,t,b} \quad \text{[Equation 3]}$$

Herein, $g_i^m$ represents an output lower limit of generator i, $u_{i,t}$ represents an on/off state of the emergency internal combustion generator i at time t, and $g_{i,t,b}$ represents an output of a section b of the emergency internal combustion generator i at time t.

The output of the emergency internal combustion generator should be 0 in the case of off state ($u_i$, t=0) and should be equal to or greater than the minimum output $g_i^m$ of the generator in the case of on state ($u_i$, t=1).

Therefore, the following constraint condition may be added to properly represent such situation.

$$0 \le g_{i,t,b} \le g_{i,b}^M u_{i,t} \quad \text{[Equation 4]}$$

Herein, $g_{i,b}^M$ may be the maximum output corresponding to the section b of the generator i. In this case, the linearized fuel cost for each section may be expressed as Equation 5 below.

$$FLC_{i,t} = FLC_i^m u_{i,t} + \sum_b MC_{i,b} g_{i,t,b} \quad \text{[Equation 5]}$$

Herein, $$g_i^m,$$

is a fuel cost corresponding to the minimum output $$FLC_i^m$$

$MC_{i,b}$ represents a marginal cost corresponding to the section b of the generator i.

The startup cost of the emergency internal combustion generator is shown only when the generator is switched from the off state to the on state, and accordingly may be expressed with a variable indicating whether or not the generator is started up as shown in Equation 6 below.

$$STC_{i,t}=s_{i,t}\times STF_i \quad \text{[Equation 6]}$$

Herein, $s_{i,t}$ is a variable indicating that the emergency internal combustion generator i is started up at time t, and $STF_i$ may be the startup cost of the emergency internal combustion generator i.

The startup cost of the generator is characterized to be shown only when the emergency internal combustion generator is switched from the stop state into the operating state.

Next, the constraint conditions required for the real-time operation control mode can be greatly divided into constraints related to the emergency internal combustion generator and constraints related to the battery.

First, the constraint conditions related to the diesel generator are as follows.

Since the variables $s_{i,t}$ and $d_{i,t}$ indicating whether the emergency internal combustion generator is started up and stopped are closely related to the variable $u_{i,t}$ indicating on/off state of the emergency internal combustion generator, this may be expressed as an explicit constraint condition.

Herein, since the on/off state changes only at the time of startup or stop, the off state $u_i$, t−1=0 is switched into the on state $u_i$, t=1 at the time of startup $s_i$, t=1, and the on state $u_i$, $t-1=1$ is switched into the off state $u_i$, $t=0$ at the time of stop $d_i$, $t=1$, whereby summary thereof may be expressed as Equation 7 below.

$$u_{i,t}-u_{i,t-1}=s_{i,t}-d_{i,t} \quad \text{[Equation 7]}$$

A constraint on the minimum operation time may be expressed as Equation 8 below by using a characteristic that when the generator is started up once ($s_{i,t=1}$), the generator may not be stopped ($d_{i,t=1}$) within the minimum operation time $MUT_i$ of the generator i.

$$s_{i,t}+d_{i,t}+t_{i,t+1}+\ldots+d_{i,t+MT_i-1}\leq 1 \quad \text{[Equation 8]}$$

Similarly, a constraint on the minimum stop time $MUT_i$ may be expressed as Equation 9 below.

$$d_{i,t}+s_{i,t}+s_{i,t+1}+\ldots+s_{i,t+MDT_i-1}\leq 1 \quad \text{[Equation 9]}$$

Herein, $d_{i,t}$ and $s_{i,t}$ are variables representing the current state of the diesel generator, and the variables become one in the case of the stop state and the startup state, respectively.

Also, MUT and MDT mean the minimum operation time and minimum stop time, respectively.

In addition, a must-run state or an unavailability state may be solved by directly specifying state variables.

$$\text{must-run: } u_i, t=1 \quad \text{[Equation 10]}$$

$$\text{unavailability: } u_i, t=0 \quad \text{[Equation 11]}$$

Figure 3:
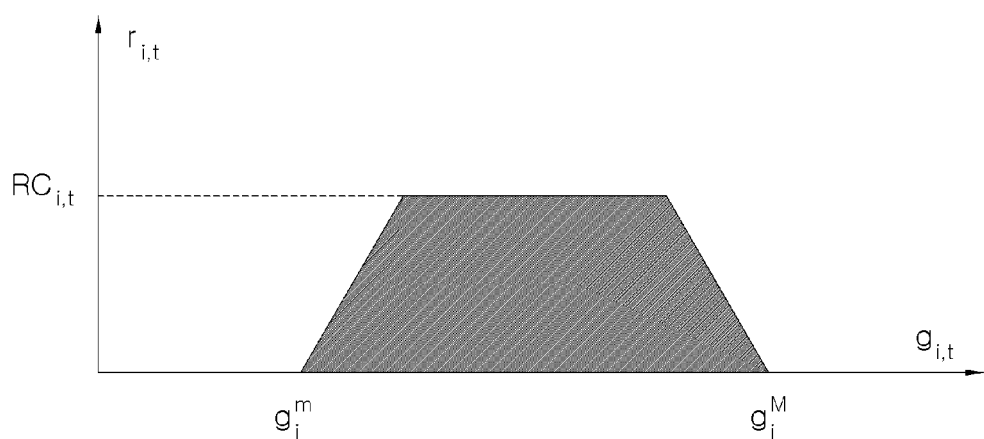
FIG. 3 is a graph illustrating a relationship between an output of the emergency internal combustion generator and a reserve power according to the present invention.

On the other hand, a net reserve power $r_{i,t}$ provided by the generator i at time t is possible only at the time of the startup. The reserve power supply amount provided by the generator may is closely related to the output of the generator as shown in FIG. 3.

These characteristics are expressed as Equations below.

$$0 \leq r_{i,t} \leq RC_{i,t} \cdot u_{i,t} \quad \text{[Equation 12]}$$

$$g_{i,t}+r_{i,t} \leq g_i^M \cdot u_{i,t} \quad \text{[Equation 13]}$$

$$g_{i,t}-r_{i,t} \geq g_i^m \cdot u_{i,t} \quad \text{[Equation 14]}$$

Herein, $RC_{i,t}$ represents the maximum reserve power capable of being provided by the generator i at time t.

Also, a constraint on the increase/decrease of the output of the generator may be expressed as a constraint equation on a difference from the output of the previous time as follows.

$$g_{i,t}-r_{i,t-1} \leq 60 \cdot RUR_i \quad \text{[Equation 15]}$$

$$g_{i,t-1}-g_{i,t} \leq 60 \cdot RDR_i \quad \text{[Equation 16]}$$

Herein, $RUR_i$ and $RDR_i$ represent an increasing rate and a decreasing rate per minute of the emergency internal combustion generator i, respectively.

The battery scheduling unit 113 may set binary variables $x_{i,t}, y_{i,t}$ indicating whether the battery is charged and discharged, and variables $g_{i,t}^x, g_{i,t}^y$ indicating the output of the battery, as constraint conditions for calculating an optimal solution, thereby calculating the output of the battery.

In this case, when charging the battery, a load is served to be expressed as negative (−) power generation, whereby the battery output may be expressed as follows.

Unlike then emergency internal combustion generator, it is assumed the battery has no limit on the minimum output.

$$g_{i,t}=g_{i,t}^x-g_{i,t}^y \quad \text{[Equation 17]}$$

$$0 \leq g_{i,t}^x \leq g_i^X \cdot x_{i,t} \quad \text{[Equation 18]}$$

$$0 \leq g_{i,t}^y \leq g_i^Y \cdot y_{i,t} \quad \text{[Equation 19]}$$

Herein $x_{i,t}$ and $g_{i,t}$ represent whether the battery is discharged and the discharging output of the battery, that is, the output of the PCS, and $y_{i,t}$ and $g_{i,t}^y$ represent whether the battery is charged and the charging load of the battery, that is, the input of the PCS.

In addition, $g_i^X$, $g_i^Y$ represent output upper limits when discharging and charging the battery i.

Unlike the emergency internal combustion generator, the battery does not require the startup and stop, but requires only restriction on following binary variables indicating whether the battery is charged and discharged.

$$x_{i,t}+y_{i,t} \leq 1 \quad \text{[Equation 20]}$$

Herein, economic feasibility of the battery without fuel cost is shown as a difference between charge time and discharge time. Therefore, in order to reflect such a characteristic, the energy stored in the battery, that is, the charging amount state (SOC) of the battery may be set as a variable $enrg_{i,t}$.

In addition, the energy is increased when the battery is charged and the energy is decreased when the battery is discharged, whereby this may be expressed as Equation 21 below by reflecting the total efficiency $\text{eff}_i$.

$$enrg_{i,t}=enrg_{i,t-1}+g_{i,t}^y \cdot \text{eff}_i - g_{i,t}^x \quad \text{[Equation 21]}$$

The battery charging/discharging amount calculation unit 220 may calculate the charging/discharging amount of the battery using Equation 21 when performing the scheduling according to the real time operation control mode.

Herein, the charging/discharging amount of the battery may be calculated as a PCS input value in which the PCS efficiency is considered by the PCS efficiency consideration unit 230.

The PCS efficiency consideration unit 230 divides the total equipment capacity of the PCS in the microgrid into a plurality of sections, and an output ratio (%) and a PCS efficiency (%) which are output value relative to the PCS equipment capacity may be set and tabulated for each section.

Herein, the output ratio (%) and the PCS efficiency (%) may be tabulated by quantitatively analyzing the PCS efficiency according to the output value for each section, resulting that the lower the output, the lower the PCS efficiency.

The PCS efficiency consideration unit 230 receives a PCS target output value primarily calculated in the battery charging/discharging amount calculation unit 220, and provides the final PCS input value to the battery charging/discharging amount calculation unit 220 by using a table in which the output ratio (%) and the PCS efficiency (%) are matched and Equations below.

$$PCS \text{ target output value (kW)=output ratio (\%)}\times PCS \text{ equipment capacity}/10 \quad \text{[Equation 22]}$$

$$\text{Final } PCS \text{ input value (kW)}=PCS \text{ target output value (kW)/efficiency (\%)}\times 100 \quad \text{[Equation 23]}$$

The battery charging/discharging amount calculation unit 220 schedules the final PCS input value with the final charging/discharging amount of the battery.

Figure 4:
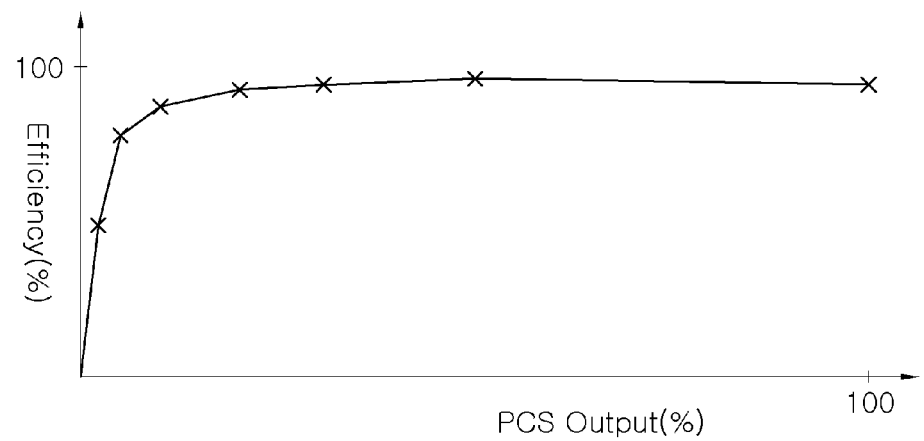
FIG. 4 is a graph illustrating the result of Table 1.

By way of example, the PCS efficiency consideration unit 230 may complete a Table 1 below and a graph of FIG. 4 according to the Table 1.

TABLE 1

| Section | Output ratio (%) | PCS efficiency (%) | PCS target output value (kW) | Final PCS input value (kW) | Section slope |
|---|---|---|---|---|---|
| 1 | 2.5 | 50 | 12.5 | 25.0 | 0.355713 |
| 2 | 5 | 84.9 | 25 | 29.4 | 0.355713 |
| 3 | 10 | 90.8 | 50 | 55.1 | 1.024787 |
| 4 | 20 | 93.8 | 100 | 106.6 | 1.030875 |
| 5 | 30 | 94.8 | 150 | 158.2 | 1.032361 |
| 6 | 50 | 95.4 | 250 | 262.1 | 1.038267 |
| 7 | 100 | 95 | 500 | 526.3 | 1.057045 |

When calculating 12.5 kW as the PCS target output value in the battery charging/discharging amount calculation unit 220, the PCS efficiency consideration unit 230 applies the PCS target output value calculated in the Equation 23 and the matching efficiency, so that the final PCS input value, 25 kW is calculated and then transmitted to the battery charging/discharging amount calculation unit 220.

On the other hand, the energy capacity and the minimum energy level of the battery may be expressed by the following constraint equation.

$$enre_i^m \leq enrg_{i,t} \leq emrg_i^M \qquad \text{[Equation 24]}$$

In addition, the initial energy state and the final energy demand of the battery may be expressed as follows.

$$enrg_{i,0} = enrg_i^0 \qquad \text{[Equation 25]}$$

$$enrg_{i,T} = enrg_i^T \qquad \text{[Equation 26]}$$

Figure 5:
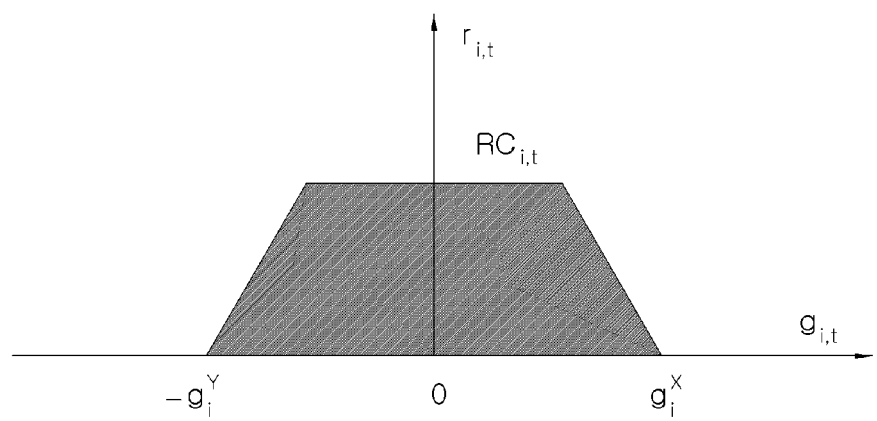
FIG. 5 is a graph illustrating a relationship between a battery output and a reserve power according to the present invention.

Herein, a relationship between the output of the battery and the reserve power may be assumed to have the form shown in FIG. 5. The relationship between the battery output and the reserve power shown in FIG. 5 may be expressed by the following constraint equation.

$$0 \leq r_{i,t} \leq RC_{i,t} \qquad \text{[Equation 27]}$$

$$g_{i,t}^x + r_{i,t} \leq g_i^X \qquad \text{[Equation 28]}$$

$$g_{i,t}^y + r_{i,t} \leq g_i^Y \qquad \text{[Equation 29]}$$

The formulation of the constraint condition related to the system operation is as follows.

The power balance condition with the loss being ignored may be a condition that the sum of the generation power to which PCS efficiency is applied is equal to the total load $L_t$.

In this case, it is possible to apply a residual demand $D_t$ excluding the amount of power generation by wind power or solar power, as in Equation 30, in order to make supply and demand condition only for the emergency internal combustion generator and the battery.

$$\Sigma_i g_{i,t} = D_t \qquad \text{[Equation 30]}$$

Herein, $\Sigma_i g_{i,t}$ is the total amount of power generation in the microgrid, that is, the total amount of power generation of the emergency internal combustion generator and the battery, which may be the amount of power generation in which the PCS efficiency is considered.

In this case, a constraint on the reserve power may be a simple form that the reserve power must be secured to be larger than a preset level $R_t$ for each time zone, which may be given as Equation below.

$$\Sigma_i r_{i,t} \geq R_t \qquad \text{[Equation 31]}$$

Herein, $\Sigma_i r_{i,t}$ is a total net reserve power in the microgrid, $R_t$ is a preset reserve power.

The controllable load scheduling unit 112 is provided to determine the output amount of load according to the calculation of the optimal solution of the emergency internal combustion generator scheduling unit 111 and the battery scheduling unit 113.

On the other hand, the scheduling unit 110 performs scheduling in the emergency operation control mode when the SOC determination unit 210 of the battery scheduling unit 113 determines that the current charging amount of the battery is out of the preset reference range.

In addition, the emergency operation control mode may be divided into a case of being out of the reference range from an upper limit and a case of being out of the reference range from a lower limit.

The scheduling unit 110 is provided to calculate a battery discharging amount for discharging the battery, stop running the emergency internal combustion generator, and allow the controllable loads to be operated by the calculated battery discharging amount in accordance with a preset priority, when the current charging amount state of the battery is higher than the preset reference range.

On the other hand, the scheduling unit 110 is provided to calculate a battery charging amount for charging the battery, operate the stopped emergency internal combustion generator, and allow the controllable loads to be cut off by the calculated battery discharging amount in accordance with a preset priority, when the current charging amount state of the battery is lower than a preset reference range.

In this case, in the emergency operation control mode, the discharging amount and the charging amount of the battery may be calculated by the battery charging/discharging amount calculation unit 220, and the final PCS input value in which the PCS efficiency is considered may be calculated by the PCS efficiency consideration unit 230.

The battery charging/discharging amount calculation unit 220 sets a target charging amount state so that the charging amount state of the battery is within the preset reference range and calculates the final PCS input value in which the PCS efficiency is considered i.e., battery charging amount or the battery discharging amount by using the following Equation, in the emergency operation control mode.

$$SOC(t) = SOC(t-1) + (PCS\ Charge - PCS\ Discharge) \times TPD \qquad \text{[Equation 32]}$$

Herein, SOC(t) is the target charging amount state of the battery, SOC (t−1) is the current (t−1) charging amount state of the battery, PCS Charge is the input of the PCS, and PCS discharge is the output of the PCS (battery charging amount or battery discharging amount), and TPD is a calculated time period.

For example, when the power situation and control priority in the microgrid are as shown in Tables 2 and 3 below, the battery charging/discharging amount calculation unit 220 may calculate the battery discharging amount using Equation 32.

TABLE 2

| | | | |
|---|---|---|---|
| Total consumption power | 100 [kW] | Battery charging (PCS output) power | 340 [kW] |
| Emergency internal combustion generator output | 0 [kW] | Battery charging amount state (SOC) | 85 [%] |
| Wind power generator output (WT) | 100 [kW] | Total load amount of system | 450 [kW] |

TABLE 2-continued

| | | | |
|---|---|---|---|
| Solar generator output (PV) | 350 [kW] | Consumer power consumption | 110 [kW] |
| Pump supply power | 10 [kW] | | |

TABLE 3

| Control Priority | Device name | Current Status | Current Output [kW] |
|---|---|---|---|
| 1 | PV #2 | On | 150 |
| 2 | WT #1 | On | 100 |
| 3 | PV #1 | On | 200 |
| 4 | A/C #1 | Off | 0 |

The battery charging/discharging amount calculation unit 220 may calculate a PCS target discharging power 350 kW via Equation 30, when the current SOC is 85%, the target SOC is 75%, and the charging power of BESS is 340 kW.

Herein, the PCS target discharging power 350 kW may be the final PCS input value in which the PCS efficiency is considered.

In this case, control is performed up to a control priority No. 2 in Table 3, the total charging power of 350 kW may be reduced. That is, since the current charging power of the BESS is 340 kW, the charging generation power of 350 kW is stopped, and as a result, the electric power discharged from the BESS may be 10 kW.

Figure 6:
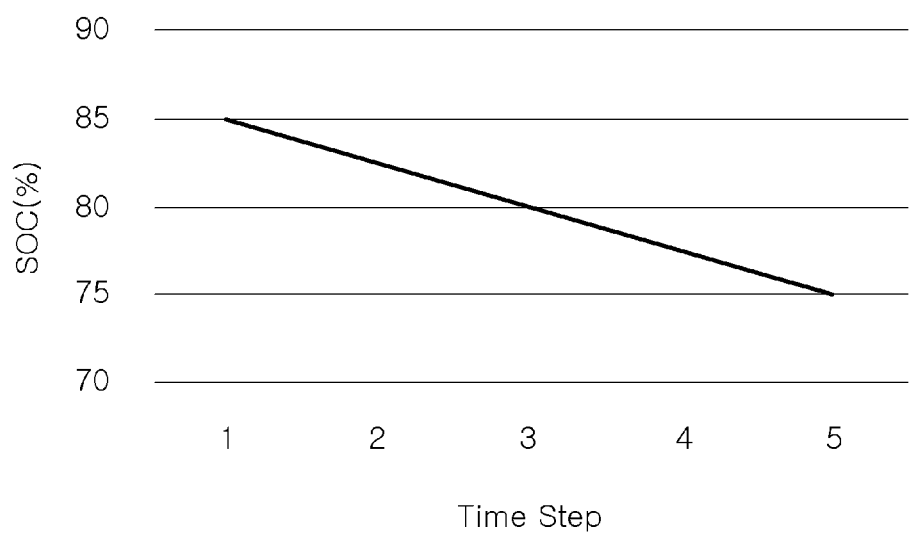
FIG. 6 is a graph illustrating a decrease due to SOC recovery in an emergency operation control mode according to an embodiment of the present invention.

As a result of the control, considering a change of SOC, the SOC is lowered and then included in the preset reference range as shown in FIG. 6.

Meanwhile, when the power situation and control priority in the microgrid are as shown in Tables 4 and 5, the battery charging/discharging amount calculation unit 220 may calculate the battery charging amount using Equation 30.

TABLE 4

| | | | |
|---|---|---|---|
| Total consumption power | 110 [kW] | Battery charging (PCS output) power | −60 [kW] |
| Emergency internal combustion generator output | 70 [kW] | Battery charging amount state (SOC) | 15 [%] |
| Wind power generator output (WT) | 0 [kW] | Total load amount of system | 70 [kW] |
| Solar generator output (PV) | 0 [kW] | Consumer power consumption | 130 [kW] |
| Pump supply power | 20 [kW | | |

TABLE 5

| Control Priority | Device name | Current Status | Current Output [kW] |
|---|---|---|---|
| 1 | DG #1 | On | 70 |
| 2 | Pump Mtr | On | 20 |
| 3 | WT #1 | Off | 0 |
| 4 | WT #2 | Off | 0 |

The battery charging/discharging amount calculation unit 220 may calculate a PCS target charging power 70 kW using the Equation 32 when the current SOC is 15%, the target SOC is 25%, and the discharging power of BESS is 60 kW.

Herein, the PCS target charging power 70 kW may be the final PCS input value in which the PCS efficiency is considered.

As may be seen from Table 5, when control is performed up to a control priority No. 3, the total discharging power of 20 kW may be turned off and the charging power of 50 kW may be turned on.

In this case, it is assumed that power of 20 kW may be immediately generated when a device WT #1 is operated. That is, the power that is finally charged on the BESS may be 10 kW.

Figure 7:
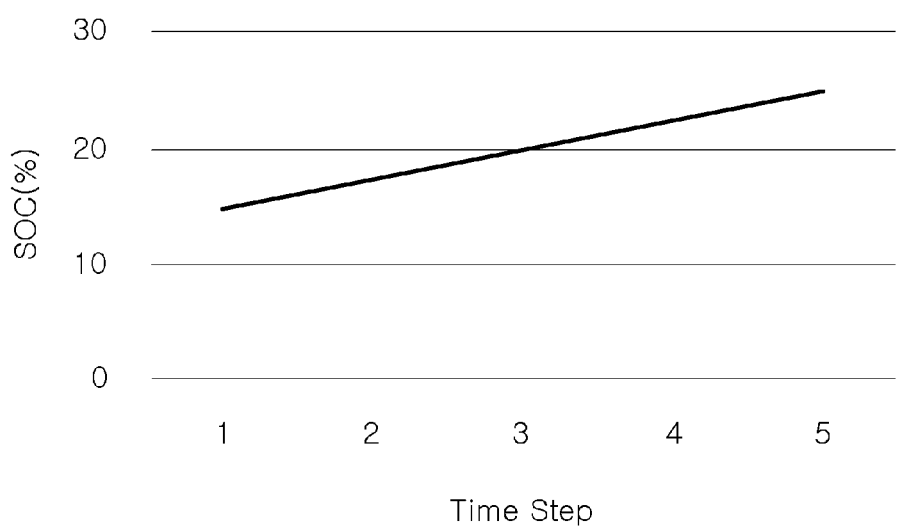
FIG. 7 is a graph illustrating an increase due to SOC recovery in an emergency operation control mode according to an embodiment of the present invention.

As a result of the control, considering a change of the SOC, the SOC is increased and then is included in the preset reference range as shown in FIG. 7.

Meanwhile, the scheduling unit 110 calculates the optimal solution according to the real-time operation control mode when the SOC is within the range of 20% to 80%, and calculates the optimal solution by changing the real-time operation control mode to the emergency operation control mode when the SOC is out of the range of 20% to 80%.

On the other hand, in the case that the SOC is included in the reference range by the execution of the emergency operation control mode, the scheduling unit 110 performs control so that a real-time operation control unit 131 is operated in real-time operation control mode when the current charging amount (SOC) of the battery reaches a first emergency operation termination reference value that is lower than an upper limit value of the preset reference range by a preset value. That is, in the state where the emergency operation control unit 132 is operating according to the emergency operation mode, for example, when the SOC reaches 75% of a first emergency operation termination limit value, the scheduling unit 110 performs control so that the real-time operation control unit 131 is operated according to the real-time operation control mode.

Meanwhile, the scheduling unit 110 performs control so that the real-time operation control unit 131 is operated in the real-time operation control mode when the SOC reaches a second emergency operation termination reference value that is higher than a lower limit value of the preset reference range by a preset value. That is, in the state where the emergency operation control unit 132 according to the emergency operation mode is operated, for example, when the SOC reaches 25% of the second emergency operation termination reference value, the scheduling unit 110 performs control so that the real-time operation control unit 131 is operated according to the real-time operation control mode This makes it possible to prevent the battery from being repeatedly charged or discharged in a boundary region between the SOC range (reference range) of the real-time operation control mode and the SOC range (range outside the reference range) of the emergency operation control mode.

The error range determination unit 114 determines whether the control parameters calculated from the respective scheduling units 111, 112, and 113, that is, the battery charging/discharging amount, the power generation amount of the emergency internal combustion generator, and the output amount of the controllable load are within error ranges of predicted amounts predicted by the data prediction device 70, performs the optimal solution calculating process of the scheduling unit 110 again when the control parameters are out of the error ranges, and transmits the respective calculated control parameters to the operation control unit 120 when the control parameters are within the error ranges.

The operation control unit 120 may control the operation of equipment according to the charging/discharging of the scheduled battery, the output of the emergency internal combustion generator, and the output of the controllable load according to the real-time operation control mode or the emergency operation control mode of the scheduling unit 110.

Figure 8A:
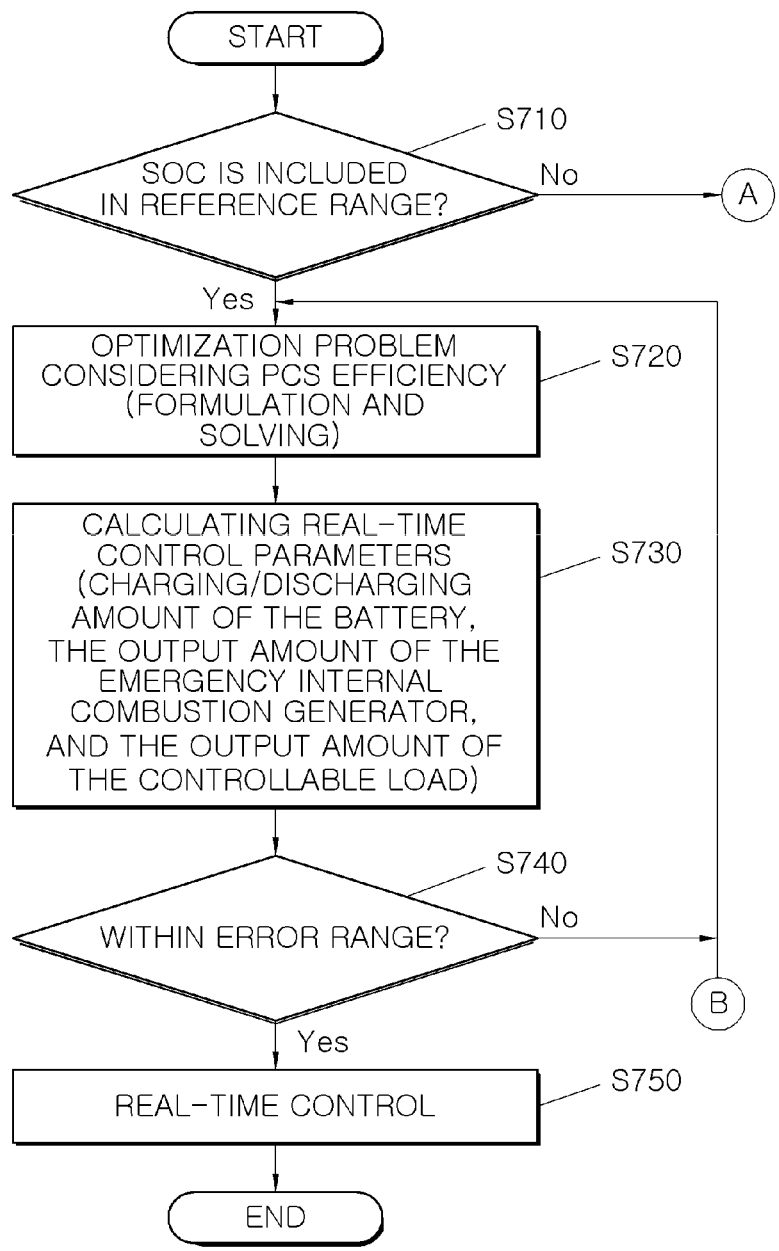
FIGS. 8A and 8B are a flowchart illustrating a microgrid operation method according to an embodiment of the present invention.
Figure 8B:
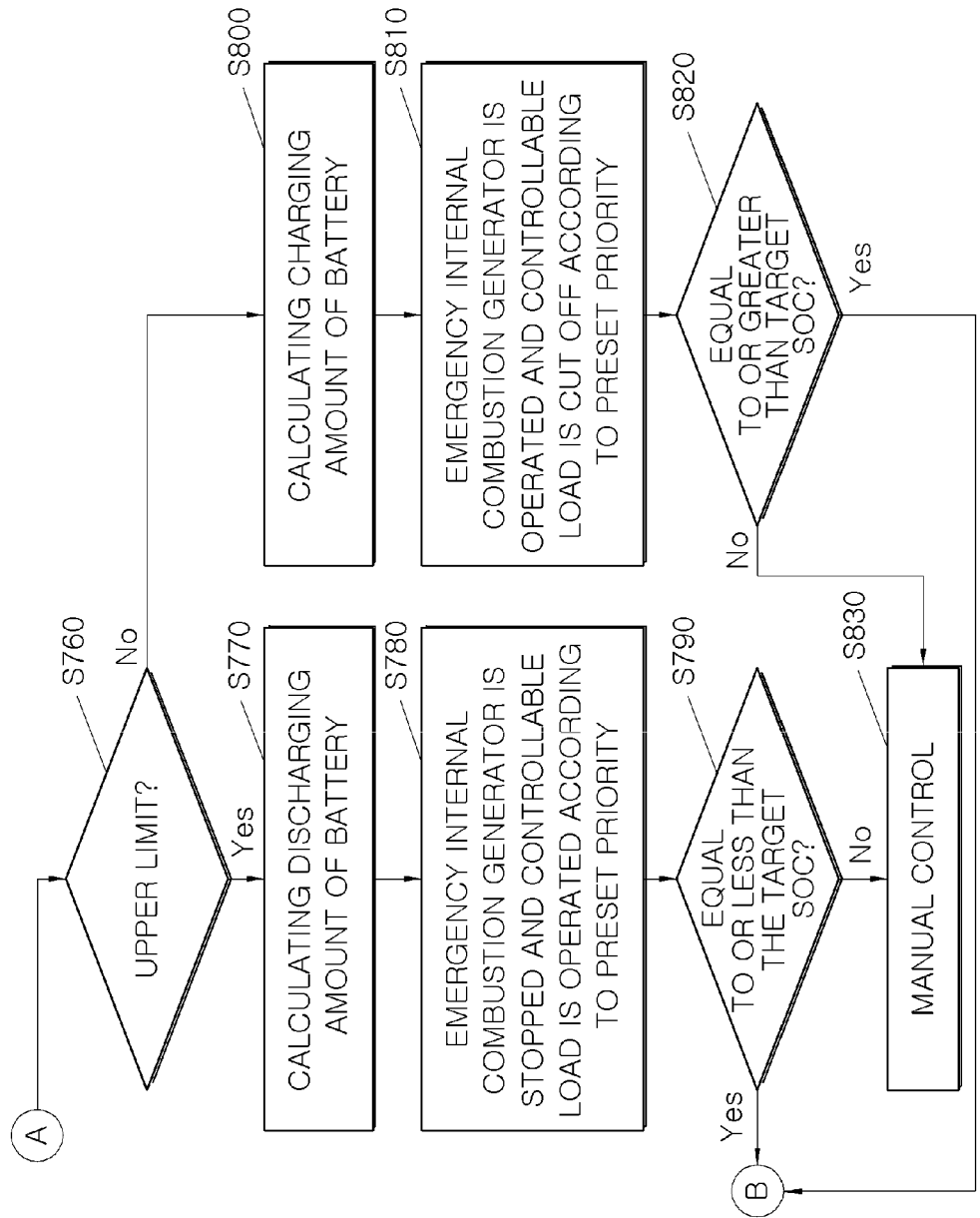

FIGS. 8A and 8B are a flowchart illustrating a microgrid operation method according to an embodiment of the present invention.

Referring to FIGS. 8A and 8B, it is determined whether the SOC of the battery is included in the reference range (S710), whereby it is possible to perform the scheduling according to the real-time operation control mode or the scheduling according to the emergency operation control mode.

In this case, for the purpose of the scheduling, it is possible to perform the scheduling by using data such as a predicted power generation amount of the new renewable energy power source, a predicted amount of the load, a predicted amount of the residual load, and the like that are predicted at a preset period (long period and short period) through real-time event information such as real-time weather forecast, the load amount of each load, and the amount of power generation of the new renewable energy power source.

Next, when the current SOC of the battery is included in the preset reference range, according to the real-time operation control mode, the optimization problem considering the PCS efficiency is formulated and the problem solving of the constraint conditions is performed (S720) to calculate the optimal solution. That is, real-time control parameters (charging/discharging amount of the battery, the output amount of the emergency internal combustion generator, and the output amount of the controllable load) for controlling equipment may be calculated (S730).

In this case, the optimal solution calculation may be performed through Equations 1 to 31 described above.

Next, it is determined whether the calculated control parameters, i.e., the charging/discharging amount of the battery, the power generation amount of the emergency internal combustion generator, and the output amount of the controllable load are within the error ranges of the predicted amounts predicted by the data prediction device 70 (S740). The optimal solution calculation process may be re-performed through S720 and S730 when the control parameters are out of the error ranges, and each calculated control parameter may be transmitted to the operation control unit 120 when the control parameters are within the error ranges.

In this case, the operation control unit 120 may control equipment in real time according to the calculated parameters.

Meanwhile, when the current SOC of the battery is out of an upper limit value of the reference range (S760: Y), the operation control unit 120 performs control so that the battery discharging amount to which the PCS efficiency is applied is calculated using Equation 30 (S770), and the emergency internal combustion generator is stopped and the controllable load is operated by the calculated batter discharging amount according to the preset priority (S780).

In this case, when the SOC is lowered according to the emergency operation control mode and then is equal to or less than the target SOC (the first emergency operation termination reference value) (S790), the operation is controlled to be returned to the real time operation control mode, that is, the step S720.

On the other hand, when the SOC is not lowered even in the emergency operation control mode, the PCS output value is controlled via the manual mode.

When the current SOC of the battery is out of a lower limit value of the reference range (S760: N), the operation control unit 120 performs control so that the battery charging amount to which the PCS efficiency is applied is calculated using the Equation 32 (S800), and the emergency internal combustion generator is operated and the controllable load is cut off by the calculated battery charging amount according to the preset priority (S810).

In this case, according to the emergency operation control mode, when the SOC is lowered and then is equal to or greater than the target SOC (the second emergency operation termination reference value) (S820), the operation is controlled to be returned to the real time operation control mode, that is, the step S720.

On the other hand, when the SOC is not lowered even in the emergency operation control mode, the PCS output value is controlled via the manual mode.

As a result, it is possible to optimally control the SOC of the battery by performing load leveling and peak shifting of the overall loads of the microgrid.

In addition, by reducing the number of charging/discharging cycles of the battery, it is possible to drastically reduce the replacement cost of the battery which is the most expensive device among configurations of the microgrid system.

While the present invention has been described with reference to the exemplary embodiments, it will be apparent to those skilled in the art that the invention is not limited to the disclosed embodiments, but, on the contrary, various modifications and variations can be made in the present invention without departing from the spirit and scope thereof. Accordingly, it is intended that the present invention covers the modifications and variations of this invention provided they fall within the scope of the appended claims and their equivalents.

DESCRIPTION OF REFERENCE NUMERALS

100: microgrid operation device
110: scheduling unit
111: emergency internal combustion generator scheduling unit
112: controllable load scheduling unit
113: battery scheduling unit
210: SOC determination unit
220: charging/discharging amount calculation unit
230: PCS efficiency consideration unit
114: error range determination unit
120: operation control unit
121: real-time operation control unit
122: emergency operation control unit

The invention claimed is:

1. A microgrid operation device considering efficiency of a power conditioning system (PCS), the device comprising:
a scheduling unit scheduling outputs of an emergency internal combustion generator, a controllable load, and a battery operated in a microgrid; and
an operation control unit controlling operations of the battery, the emergency internal combustion generator, and the controllable load according to charging/discharging of the battery, the output of the emergency internal combustion generator, and the output of the controllable load, which have been scheduled by the scheduling unit,
wherein the scheduling unit schedules the charging/discharging by considering the efficiency of the PCS so that a state of charge (SOC) of the battery is maintained within a preset range,
wherein the scheduling unit includes an emergency internal combustion generator scheduling unit, a controllable load scheduling unit, and a battery scheduling unit, and the battery scheduling unit includes:
an SOC determination unit determining a current SOC of the battery;
a charging/discharging amount calculation unit calculating a charging/discharging amount of the battery; and
a PCS efficiency consideration unit considering the efficiency of the PCS,
wherein the PCS efficiency consideration unit receives a POS target output value calculated by the battery charging/discharging amount calculation unit, calculates a final PCS input value, and provides the final calculated PCS input value to the charging/discharging amount calculation unit.

2. The device of claim 1,
wherein the scheduling unit performs the scheduling by selecting a scheduling control mode as a real-time operation control mode or an emergency operation control mode according to the SOC determined by the SOC determination unit.

3. The device of claim 2,
wherein the scheduling unit schedules operations and outputs of the emergency internal combustion generator, the controllable load, and the battery in the real time operation control mode so that a charging amount of the battery is maintained when the charging amount of the battery is within a preset reference range.

4. The device of claim 3,
wherein the preset reference range of the charging amount of the battery is an SOC of 20% to 80%.

5. The device of claim 4,
wherein when performing the scheduling in the real-time operation control mode, the emergency internal combustion generator scheduling unit, the controllable load scheduling unit, and the battery scheduling unit are provided to schedule the outputs of the emergency internal combustion generator, the controllable load, and the battery by calculating an optimal solution using an objective function for minimizing a total sum of a startup cost and a power generation cost of the emergency internal combustion generator in the microgrid and a constraint condition for the objective function.

6. The device of claim 1,
wherein the scheduling unit is provided to schedule the operations and outputs of the emergency internal combustion generator, the controllable load, and the battery in the emergency operation control mode so that the charging amount of the battery falls within the preset reference range when the charging amount of the battery is out of the preset reference range.

7. The device of claim 6,
wherein the scheduling unit is provided to calculate a discharging amount of the battery for discharging the battery, stop running the emergency internal combustion generator, and allow the controllable load to be operated by the calculated discharging amount of the battery according to a preset priority, when the charging amount of the battery is higher than the preset reference range.

8. The device of claim 6,
wherein the scheduling unit is provided to calculate a charging amount of the battery for charging the battery, operate the stopped emergency internal combustion generator, and allow the controllable load to be cut off by the calculated charging amount of the battery according to a preset priority, when the charging amount of the battery is lower than the preset reference range.

9. The device of claim 7,
wherein the battery charging/discharging amount calculation unit sets a target charging amount of the battery and calculates a final charging/discharging amount in which the PCS efficiency is considered by a following equation, in the emergency operation control mode:

$$SOC(t)=SOC(t-1)+(PCS\ Charge-PCS\ Discharge)\times TPD$$

(herein, SOC(t): a target charging amount state of the battery, SOC(t−1): a current (t−1) charging amount state of the battery, PCS Charge: an input of the PCS, PCS Discharge: an output of the PCS (battery charging amount or battery discharging amount), and TPD: a calculated time period).

10. The device of claim 8,
wherein the battery charging/discharging amount calculation unit sets a target charging amount of the battery and calculates a final charging/discharging amount in which the PCS efficiency is considered by a following equation, in the emergency operation control mode:

$$SOC(t)=SOC(t-1)+(PCS\ Charge-PCS\ Discharge)\times TPD$$

(herein, SOC(t): a target charging amount state of the battery, SOC(t−1): a current (t−1) charging amount state of the battery, PCS Charge: an input of the PCS, PCS Discharge: an output of the PCS (battery charging amount or battery discharging amount), and TPD: a calculated time period).

11. A microgrid operation method considering PCS efficiency, the method comprising:
determining whether a SOC of a battery operated in the microgrid is included in a preset reference range;
calculating an optimal solution by using an objective function for minimizing a total sum of a startup cost and a power generation cost of an emergency internal combustion generator in the microgrid and a constraint condition for the objective function when the SOC of the battery is within the preset reference range;
calculating outputs of the emergency internal combustion generator, a controllable load, and the battery in the microgrid by considering the PCC efficiency through the optimal solution;
calculating a charging amount of the battery to which the PCS efficiency is applied when the SOC of the battery is out of a lower limit value of the preset reference range; and
operating the stopped emergency internal combustion generator and performing control so that the controllable load is cut off by the calculated battery charging amount according to a preset Priority,
wherein the charging amount and the discharging amount of the battery set a target charging amount of the battery and a final charging/discharging amount is calculated in consideration of the PCS efficiency by the following equation:

$$SOC(t)=SOC(t-1)+(PCS\ Charge-PCS\ Discharge)\times TPD$$

(herein, SOC(t): a target charging amount state of the battery, SOC(t−1): a current t−1 charging amount state of the battery, PCS Charge: an input of the PCS, PCS Discharge: an output of the PCS (battery charging amount or battery discharging amount), and TPD: a calculated time period).

12. The method of claim 11, further comprising:
scheduling operations and outputs of the emergency internal combustion generator, the controllable load, and the battery in a real time operation control mode in which a charging amount of the battery is maintained when the SOC of the battery is within the preset reference range.

13. The method of claim 12,
wherein the preset reference range of the SOC of the battery is 20% to 80%.

14. The method of claim 11, further comprising:
calculating a discharging amount of the battery to which the PCS efficiency is applied when the SOC of the battery is out of an upper limit value of the preset reference range; and
stopping running the emergency internal combustion generator and performing control so that the controllable load is operated by the calculated discharging amount of battery according to a preset priority.

15. The method of claim 14,
wherein the charging amount and the discharging amount of the battery are calculated in consideration of a PCS input value.

16. A microgrid operation method considering PCS efficiency, the method comprising:
determining whether a SOC of a battery operated in the microgrid is included in a preset reference range;
calculating an optimal solution by using an objective function for minimizing a total sum of a startup cost and a power generation cost of an emergency internal combustion generator in the microgrid and a constraint condition for the objective function when the SOC of the battery is within the preset reference range;
calculating outputs of the emergency internal combustion generator, a controllable load, and the battery in the microgrid by considering the PCC efficiency through the optimal solution;
calculating a charging amount of the battery to which the PCS efficiency is applied when the SOC of the battery is out of a lower limit value of the reset reference range; and
operating the stopped emergency internal combustion generator and performing control so that the controllable load is cut off by the calculated battery charging amount according to a preset Priority,
wherein the charging amount and the discharging amount of the battery are calculated in consideration of a PCS input value,
wherein the charging amount and the discharging amount of the battery set a target charging amount of the battery and a final charging/discharging amount is calculated in consideration of the PCS efficiency by the following equation:

$$SOC(t)=SOC(t-1)+(PCS\ \text{Charge}-PCS\ \text{Discharge})\times TPD$$

(herein, SOC(t): a target charging amount state of the battery, SOC(t−1): a current (t−1) charging amount state of the battery, PCS Charge: an input of the PCS, PCS Discharge: an output of the PCS (battery charging amount or battery discharging amount), and TPD: a calculated time period).

* * * * *